United States Patent [19]

Kub et al.

[11] 4,315,164
[45] Feb. 9, 1982

[54] BIDIRECTIONAL CHARGE CONTROL CIRCUIT

[75] Inventors: Francis J. Kub, Pasadena; Marvin H. White, Columbia; Ingham A. G. Mack, Laurel; Donald R. Lampe, Ellicott City, all of Md.

[73] Assignee: Westinghouse Electric Corp., Pittsburgh, Pa.

[21] Appl. No.: 139,376

[22] Filed: Apr. 8, 1980

[51] Int. Cl.³ .................. G11C 19/28; H01L 29/78
[52] U.S. Cl. ............................ 307/221 D; 357/24
[58] Field of Search .............. 357/24; 307/221 D; 333/165

[56] References Cited

U.S. PATENT DOCUMENTS 4,085,441 4/1978 Fagan .................. 307/221 D

OTHER PUBLICATIONS

White et al, "Charge-Coupled Device (CCD) Adaptive Discrete Analog Signal Processing", IEEE J. Solid-State Circuits, vol. SC-14 (2/79) pp. 132-146.
White et al, "CCD Analog Adaptive Signal Processing", 1978 Int. Conf. Application Charge Coupled Devices, San Diego (10/78), Proc., pp. 3A-1 to 3A-14.

*Primary Examiner*—Gene M. Munson
*Attorney, Agent, or Firm*—W. E. Zitelli

[57] ABSTRACT

A charge control circuit for bidirectionally transferring metered amounts of charge, selectively, through a transfer channel of a four gate electrode charge coupled device (CCD) is disclosed. The bidirectional charge control circuit is used primarily to increment and decrement metered amounts of charge respectively to and from a charge storage medium. More specifically, five electrical signals are generated to have varying potentials in accordance with predetermined time sequences. These signals are applied to the four gate electrode CCD in a selected one of two states to either increment or decrement a metered amount of charge therethrough to or from the charge storage medium respectively, in a predetermined number of five segments. One of the generated signals governs the metering of charge for each increment or decrement operation.

14 Claims, 7 Drawing Figures

BIDIRECTIONAL CHARGE CONTROL CIRCUIT

GOVERNMENT CONTRACT CLAUSE

The invention herein described was made in the course of a contract or subcontract thereunder with the Department of the Navy bearing number N00173-77-C-0328.

BACKGROUND OF THE INVENTION

This invention relates broadly to the field of transferring charge in a charge-coupled device (CCD), and more particularly, to a charge control circuit for bidirectionally transferring metered amounts of charge, selectively, in a CCD.

A description of a proposed charge-coupled device type adaptive signal processor exemplifying the utility of the present invention may be found in (1) a Paper entitled "CCD Analog Adaptive Signal Processing" authored by M. H. White, I. A. Mack, G. M. Borsuk, D. R. Lampe, and F. Kub, which was presented before the 1978 International Conference on the Application of Charge Coupled Devices at the Naval Ocean Systems Center, San Diego, Calif. from Oct. 25 through 27, 1978, pp. 3A-1 through 3A-14; and (2) a Paper entitled "Charge-Coupled Device (CCD) Adaptive Discrete Analog Signal Processing" authored by M. H. White et al., same author combination as Paper (1), which was presented in the IEEE Journal of Solid-State Circuits, Vol. SC-14, No. 1, February 1979. Signal processors of this type are proposed as using a so-called "clipped-data" least mean square (LMS) error algorithm to optimize the selection of tap weights in a CCD filter. The CCD filter may be comprised of a basic linear combiner formed with a nondestructively tapped CCD analog delay line and electrically reprogrammable MOS analog conductances as the tap weights. One method of varying the analog conductance of the MOS transistors in the proposed filters is to vary the gate voltage thereof while keeping the source and threshold voltage $V_T$ substantially fixed.

Both of the above Papers (1) and (2) proposed the use of a CCD bidirectional charge control weight adjustment for varying the $V_{GS}$ of each of the MOS transistors used as the tap weights. For more details, reference is made to pages 3A-6 and 3A-7 of Paper (1) and pages 137 and 138 of Paper (2). While the basic idea of bidirectionally controlling charge to provide a variable $V_{GS}$ on the gate of an MOS transistor has been proposed in the Papers (1) and (2) above, it is realized that these ideas were an alternate method of controlling the tap weights and were not used in the ultimate design of the adaptive filter as described in said Papers. In addition, it should be noted that the details of the structure of a bidirectional charge control circuit were not included in either of the Papers (1) or (2) referenced hereabove.

Carrying this one step further, it is well known that charge may be unidirectionally injected and transferred through a charge-coupled device for a large variety of applications. An example of one application is the adding or subtracting of charge in a holding well of a CCD structure as disclosed in U.S. Pat. No. 4,085,441, issued Apr. 18, 1978 and entitled "Monolithic Implementation of a Fast Fourier Transform"; refer more particularly to FIGS. 5 and 6 thereof. Another example of a unidirectional charge injection CCD application is disclosed in U.S. Pat. No. 4,112,456, issued Sept. 5, 1978 to Lampe et al. and entitled "Stabilized Charge Injector for Charge Coupled Devices with Means for Increasing the Speed of Propagation of Charge Carriers". However, neither of the proposed structures disclosed in these references suggested the idea of bidirectional charge transfer as discussed, generally, in the Papers (1) and (2) supra.

Since a need has been proposed for a bidirectionally charge-controlled circuit, then, the disclosure of at least one embodiment of such a circuit, especially for use in the charge-coupled device type adaptive signal processors described in connection with Papers (1) and (2) referenced hereabove, appears most desirable. Thus, it is the intention of the following specification to describe such a bidirectional charge control circuit for accurately incrementing and decrementing charge selectively to and from a charge storage medium.

SUMMARY OF THE INVENTION

In accordance with the present invention, a bidirectional charge control circuit increments and decrements metered amounts of charge on a charge storage medium. More specifically, the circuit includes a semiconductor substrate doped with a first impurity and having a predefined charge transfer channel therein. A gate dielectric is disposed on the surface of the substrate at least covering the predefined channel. A first semiconductor region, doped with a second impurity type, is disposed at one end of the channel and located at the surface of the substrate body. The charge storage medium is coupled to another end of the predefined channel opposite the one end in the direction of charge transfer. First, second, third and fourth gate electrodes are disposed on the gate dielectric layer adjacently aligned, respectively, in a direction from the first doped region to the charge storage medium across the predefined channel surface area. The gate electrodes are substantially isolated from each other, the first doped region and the charge storage medium.

A first electrical signal, coupled electrically to the first doped region, is operative to provide charge thereto in accordance with a first timing signal. A first electrical circuit generates second and third electrical signals which have varying potentials respectively corresponding to second and third timing sequences. An electrical switch is selectively operative in a first state to couple the second and third electrical signals to the first and third gate electrodes, respectively, for incrementing charge, and in a second state, to couple the second and third signals to the third and first gate electrodes, respectively, for decrementing charge. A fourth electrical signal, coupled electrically to the second gate electrode, has at times a governing potential, commensurate with the metered charge associated with the incrementing and decrementing operations. A second electrical circuit generates a fifth electrical signal which has a potential varying in accordance with a fourth timing sequence. The fifth electrical signal is coupled to the fourth gate electrode.

In operation then, metered amounts of charge may be incremented and decremented, selectively, to and from the charge storage medium, respectively, in accordance with the time varying potential sequences of the first through the fifth generated electrical signals and the selective operations of the electrical switch.

DESCRIPTION OF THE PREFERRED EMBODIMENT

Figure 1:
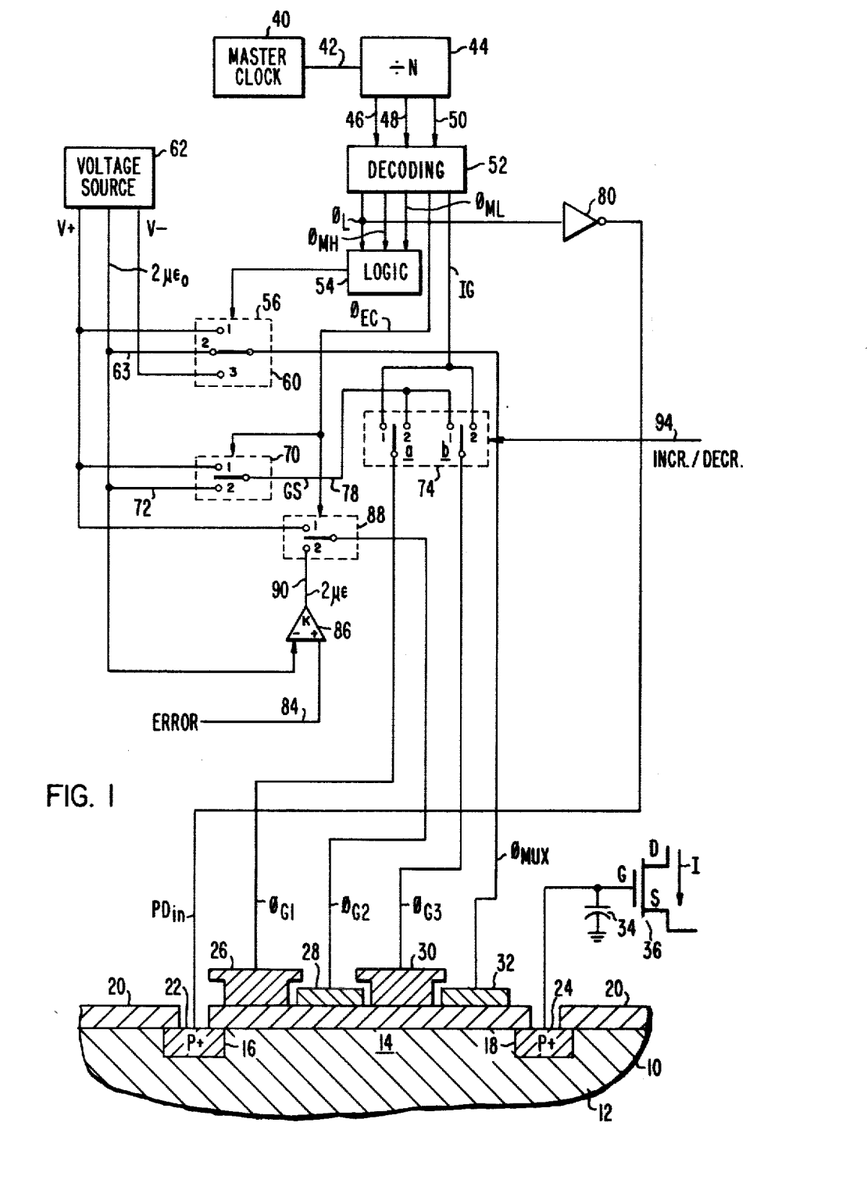
FIG. 1 is a block diagram schematic of a circuit suitable for embodying the principles of the present invention.

Referring to FIG. 1, a cross-sectional view of a charge-coupled device having a four-gate electrode structure is depicted at 10. The cross-sectional cut is made lateral to the direction of charge transfer therethrough. The charge-coupled device 10 comprises a semiconductor substrate body 12 which may be doped with a first impurity type, like an N-type impurity, for example. A region 14 at the surface of the substrate 12 may be predefined as the charge transfer channel of the device 10. First and second semiconductor regions 16 and 18, respectively, may be disposed at each end of the predefined channel 14 and located at the surface of the substrate body 12. These regions 16 and 18 may be doped with a second impurity type, like P+-type, for example. A gate dielectric layer 20 may be disposed on the surface of the substrate body 12 at least covering the predefined charge transfer channel 14 and exposing surface areas 22 and 24 of the doped regions 16 and 18, respectively. Four gate electrodes 26, 28, 30 and 32 may be disposed on the gate dielectric 20, adjacently aligned, respectively, in a direction from the doped region 16 to the doped region 18 across the predefined channel area 14. These gate electrodes 26, 28, 30 and 32 may be substantially isolated from each other and the doped regions 16 and 18.

Electrical signals denoted as $\phi_{I}$, $\phi_{II}$, $\phi_{III}$, and $\phi_{VIII}$ may be coupled electrically to the gate electrodes 26, 28, 30, and 32, respectively. Another electrical signal denoted as $PD_{sp}$ may be coupled electrically to the doped region 16 utilizing window area 22. In some cases the capacitance of the doped region 18 may be considered sufficient for a charge storage medium from which to increment and decrement a metered amount of charge to and from, respectively. In other cases, however, an auxiliary charge storage medium, like the capacitor shown at 34, for example, may be coupled utilizing window area 24 to the doped region 18 for increasing the charge storage capacity thereof. In either case, the potential resulting on the medium as a result of the charge storage thereon may be utilized for various applications, one being to control the gate voltage of an MOS transistor like that shown at 36, for example.

As described in the aforementioned Papers (1) and (2) referenced in the Background section hereinabove, the MOS transistor 36 may be utilized as a multiplier, that is, if the source voltage is maintained substantially constant, the current I passing through the drain-to-source channel of the MOS transistor 36 is proportional to the product of the conductance and the drain-to-source potential thereof. In turn, the conductance is directly proportional to the gate-to-source potential applied to the MOS transistor 36 which in essence is varied by the gate voltage. In the present embodiment, the gate voltage is the potential which exists across the charge storage medium and is varied by the incrementing and decrementing operations of the charge-coupled device 10 as will be more fully described in the following paragraphs.

It is further understood by those skilled in the pertinent art that the charge storage medium may also be a charge holding well of another CCD structure. In this application metered amounts of charge may be incremented or decremented from the charge holding well.

Figure 2:
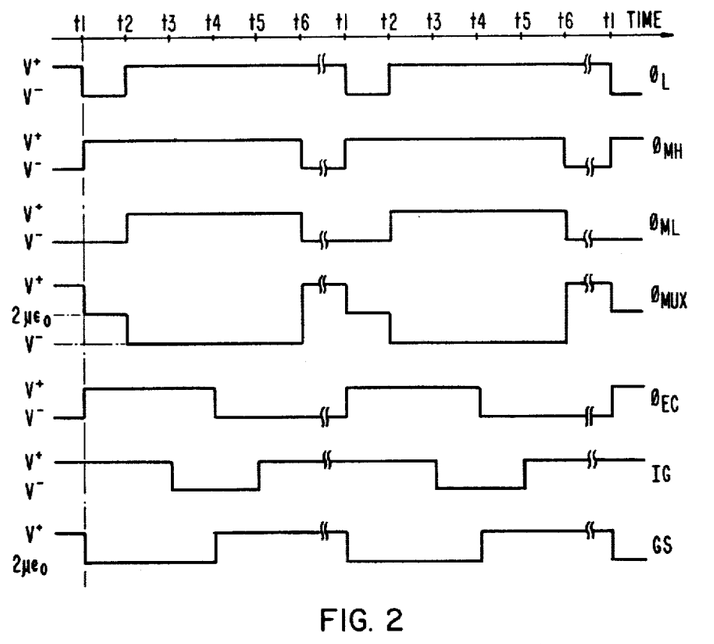
FIG. 2 exhibits timing diagrams illustrative of the potential variations of the signals generated by the circuit embodiment of FIG. 1.

The electrical signals apply to the gate electrodes of the charge-coupled device 10 and the electrical signal applied to the doped region 16 may be derived utilizing the remaining circuitry schematically illustrated in the embodiment of FIG. 1 and in accordance with the specified waveforms depicted in FIG. 2. For example, a conventional master clock circuit denoted by block 40 may be configured to effect a clock signal over signal line 42 which is conducted to a plurality of flip-flops of a well-known divide by N configuration as shown by the block 44. Selected outputs from the flip-flops of the block 44 denoted by the signal lines 46, 48 and 50, for example, may be coupled to a decoding block of logic circuitry such as that shown at 52. The decoding circuitry of 52 may be configured to effect the periodic electrical signal waveforms of $\phi_I$, $\phi_{III}$, $\phi_{VII}$, $\phi_{VI}$, and $\phi_{VI}$, as illustratively shown in FIG. 2, over the signal lines denoted by the same respective notation.

These waveforms of FIG. 2 may be specified to have a periodicity including at least six time segments separated by the times denoted as t1 through t6. Three of the derived electrical signals $\phi_I$, $\phi_{III}$ and $\phi_{VII}$ may be coupled to a combinational logic circuit denoted at 54 to provide a switch control signal 56 having the characteristics to control a three-position-single-pole electrical switch, such as that shown at 60, in a time sequence manner to produce the potential waveform $\phi_{VIII}$ as illustrated in FIG. 2.

With regard to the position connections of switch 60, a positive voltage potential $V^+$ may be derived from a conventional regulated voltage source, such as that shown at block 62, and coupled to the switch position one; a negative voltage potential $V^-$ may be also derived from the source 62 in a conventional manner and coupled to the switch position 3. A reference voltage potential denoted as $2\mu_{cm}$ may be derived conventionally from the voltage potentials $V^+$ and $V^-$ of the voltage source 62 and coupled to the switch position 2 of 56 using signal line 63.

In another part of the circuit embodiment of FIG. 1, the electrical signal at $\phi_{VI}$ may be coupled to the control input of a single-pole double-throw switch 70 which has one of its two positions connected to the $V^+$ potential and the other of its positions connected to the reference voltage potential $2\mu_{cm}$ over signal line 72. The pole position of the switch 70 is coupled to a double-pole-double-throw (DPDT) switch 74. More specifically, a line 78 from the pole of switch 70 may be connected to the second position of a switch "a" and the first position of a switch "b" in 74. The electrical signal $\phi_{\epsilon C}$ governs the switching operation of 70 to effect a periodic waveform such as that shown illustratively at GS in FIG. 2.

Still further in the circuit embodiment of FIG. 1, the electrical signal IG may be coupled to the first position of switch "a" and the second position of switch "b" in the DPDT switch 74. The pole position of 74a may be coupled to the gate electrode 26 and similarly, the pole position of 74b may be coupled to gate electrode 30, both of the charge-coupled device 10. An increment-/decrement signal 94 controls the position select of the double-pole-double-throw switch 74 which affects either an increment or a decrement operation in the CCD 10.

The signal $\phi_L$ from the decoder 52 may be coupled to a conventional inverter 80, the output of which provides the signal $PD_{in}$ to the CCD region 22.

For the purposes of establishing a metered amount of charge to be incremented or decremented respectively to or from the doped region 18 in the charge control device 10, a governing voltage potential denoted as $2\mu\epsilon$ may be derived in the present embodiment by subtracting the reference potential $2\mu\epsilon_0$ from a predetermined error signal at 84 in a conventional differential amplifier circuit at 86 having an effective voltage gain of approximately $2\mu$. The resulting governing potential $2\mu\epsilon$ may be provided to the second position of a single-pole-double-throw switch 88 over signal line 90. The first position of switch 88 may be coupled to the V+ potential line. The pole position of switch 88 may be coupled to the gate electrode 28 of the device 10. The switch 88 may be operated between the positions 1 and 2 in accordance with the time sequence waveform of the electrical signal $\phi_{\epsilon C}$.

Figure 3:
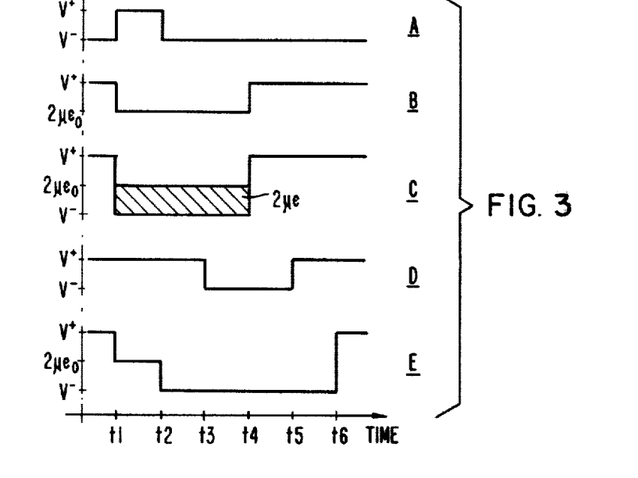
FIG. 3 illustrates the time varying potentials of the signals applied to the electrodes of the charge coupled device of FIG. 1 to increment a metered amount of charge through the charge transfer channel thereof.
Figure 4:
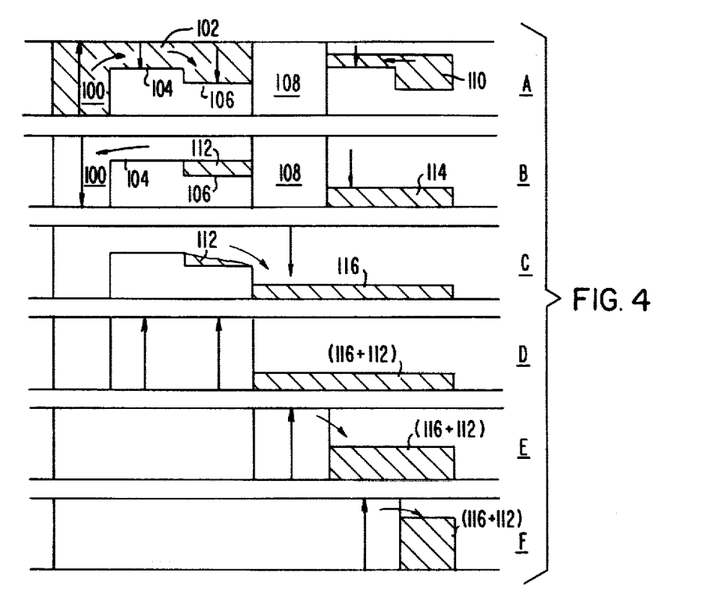
FIG. 4 depicts exemplary potential profiles under the gate electrodes of the CCD of FIG. 1 for selected times during a charge incrementation operation.

An example of incrementing a metered amount of charge on the capacitance of the region 18 may be described in connection with the waveforms of FIG. 3 and the potential profile diagrams of FIG. 4. Referring specifically to FIG. 3, the waveforms A through E refer respectively to the voltage potentials of the electrical signals $PD_{in}$, $\phi_{G1}$, $\phi_{G2}$, $\phi_{G3}$, $\phi_{MUX}$ which are applied concomitantly to the doped region 16 and gate electrodes of the charge-coupled device 10 as shown in the circuit embodiment of FIG. 1. Referring to FIG. 4, the potential profile diagrams A through F relate to the charge distribution in the potential wells under the gate electrodes and in the doped regions 16 and 18 of the charge-coupled device 10 and which may be effected in response to the time varying potential waveforms of the electrical signals operating the charge-coupled device 10 (refer to the waveforms of FIG. 3).

For example, the diagram A in FIG. 4 illustrates the charge distribution in the device 10 for the time immediately following time t1, accordingly diagram B refers to the charge distribution in device 10 for the time immediately following time t2, and so on down to the diagram F which relates to the time immediately following time t6. For the present embodiment and for the purposes of the following description, the voltage potential V+ may be considered a repulsive voltage potential and the voltage potential V− may be considered as a attractive voltage potential with respect to transferring charge through the predefined channel 14 of the charge-coupled device 10.

Therefore, in the example of incrementing a metered amount of charge on the doped region 18, the output of the inverter 80 generates a V+ potential in response to $\phi_L$, at approximately time t1, to fill the region 16 with a surplus of minority charged carries as denoted by the hashed area 100 in the diagram A of FIG. 4. For incrementing charge in the present embodiment, signal 94 causes both the switches 74a and 74b to be operated to position 2 which provides the electrical signal GS over signal line 78 to the first gate electrode 26 and the signal over line IG to the third gate electrode 30 of the device 10. Consequently, for the times t1 through t6 the waveforms appearing at B and D, of FIG. 3 respectively exemplify the applied voltage potentials on gates 26 and 30 consistent with the waveforms of GS and IG as shown in FIG. 2. Also at approximately time t1, the operation of switch 88 may be controlled by $\phi_{\epsilon C}$ to position 2 causing the governing voltage potential $2\mu\epsilon$ to be applied to the gate electrode 28. The waveform C of FIG. 3 from time t1 to time t4 exemplifies a hashed notation illustrating the variability of the governing voltage potential $2\mu\epsilon$ using $2\mu\epsilon_0$ as a reference. Still further, at time t1, the voltage potential of the electrical signal $\phi_{MUX}$, as governed by the operation of switch 60, is controlled to the reference potential $2\mu\epsilon_0$.

As a result of this first state of voltage potentials of the electrical signals applied to the device 10 immediately following time t1, the potential minimum and charge distribution in the device 10 will appear as shown in the diagram A of FIG. 4. Referring to diagram A of FIG. 4, because of the voltage potentials of the electrical signals applied to gates 26 and 28 immediately following time t1 as exhibited by the waveforms B and C of FIG. 3, charge may be distributed in the potential wells thereunder as exhibited by the hashed area 102. The difference in the potentials in the wells under gates 26 and 28 as exhibited by the lines 104 and 106, respectively, may be proportional to the difference between the voltage potentials of the reference potential $2\mu\epsilon_0$ and the governing potential $2\mu\epsilon$ which is commensurate with the metered amount of charge to be incremented. Since the potential applied to gate electrode 30 immediately following time t1 is repulsive no substantive charge will be stored in the potential well thereunder as exhibited by the area 108. And finally, since the voltage potential applied to the gate electrode 32 is at the reference potential $2\mu\epsilon_0$, any charge residing in the capacitance of the doped region 18 will be distributed between the potential well of the gate electrode 32 and the capacitance of the doped region 18 as exhibited by the hashed area 110.

Thereafter, at a time immediately following t2, the inverter 80 may be operated to output a V− potential as governed by $\phi_L$ causing an attractive voltage potential to be applied to the doped region 16 as shown in the time waveform A of FIG. 3. Concurrently, the switch 60 may be conducted to switch position 3 as governed by signal 56 causing voltage potential V− to be applied to the gate electrode 32 as exhibited by the time waveform E of FIG. 3. All of the other voltage potentials of the remaining applied electrical signals to the device 10 may be maintained substantially fixed immediately following time t2 as exhibited by the waveforms B, C and D of FIG. 3.

As a result of this second voltage potential state, all of the charge in the potential wells under gate electrodes 26 and 28 above the reference voltage potential denoted by the line 104 may be spilled over into the doped semiconductor region 16 as exhibited at 100 in diagram B of FIG. 4. The metered charge denoted by the hashed area 112 may be captured in the potential well under the gate electrode 28 primarily due to the greater potential minimum at 106 with respect to the reference potential minimum at 104. Since the voltage potential on gate electrode 30 remains repulsive, there is no charge, of substance, in the potential well thereunder as exhibited by the area 108. The charge distribution in the potential well under gate electrode 32 and in the capacitance of the doped semiconductor region 18 may be more evenly distributed as exhibited by the hashed area 114 in diagram B of FIG. 4.

Thereafter, at a time immediately following time t3, the voltage potential of the electrical signal IG as conducted to the gate electrode 30 through position 2 of switch 74b changes from a respulsive potential to an attractive potential (see FIG. 2). The voltage potentials of the remaining electrical signals remain substantially fixed at this time. The diagram C of FIG. 4 exhibits the operational results of this third voltage potential state.

Referring to diagram C, the charge from the capacitance of the doped region 18 may be distributed more evenly through the potential wells under the gate electrodes 30 and 32 as exhibited by the hashed area 116. Since the potential under gate electrode 30 is more attractive than that of gate electrode 28, the metered charge captured in the potential well under gate electrode 28, denoted by the hashed area 112, may be spilled over into the potential wells of gate electrodes 30 and 32 and mixed with the charge denoted at 116 thus incrementing the overall charge by the governed metered amount 112.

Thereafter, for the times immediately following times t4, t5 and t6 the voltage potentials applied to the gate electrodes 26, 28, 30, and 32 may be adjusted sequentially to a repulsive voltage potential as exhibited in the diagrams D, E and F of FIG. 4, respectively, to cause the charge in the potential wells under gate electrodes 30 and 32 to be transferred, in a push clock fashion, to the capacitance of the doped region 18 as shown in the final diagram F of FIG. 4. These operations are accomplished sequentially due to the responsiveness of the switches 88 and 60 with respect to their control signals $\phi_{cC}$ and 56, respectively, and the voltage potential of the electrical signal IG. Thus, the resulting charge on the capacitance of the doped region 18 and if necessary, the capacitor 34, for example, may be incremented by the metered amount of charge controlled by the governing potential $2\mu\epsilon$.

Figure 5:
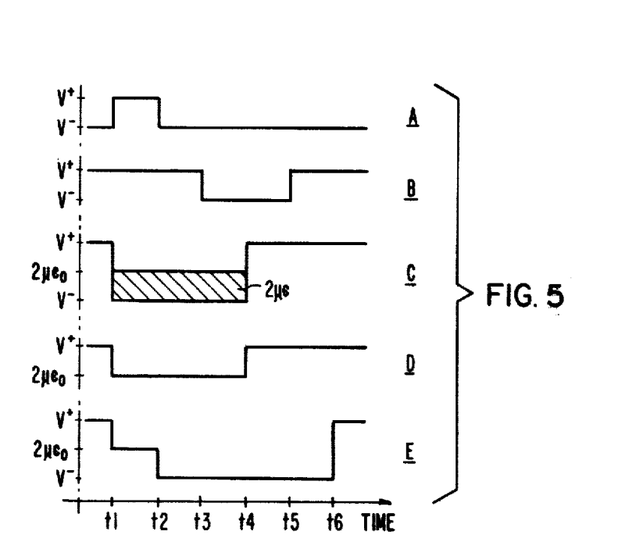
FIG. 5 illustrates the time varying potentials of the signals applied to the electrodes of the charge coupled device of FIG. 1 to decrement a metered amount of charge through the charge transfer channel thereof.

An example of operation of decrementing a metered amount of charge from the capacitance of the doped region 18 may be described in connection with the waveforms A through E of FIG. 5 and the potential profile diagrams A through F of FIG. 6 associated therewith. For the present embodiment, to decrement charge, the control signal 94 may be such to render the double-pole-double-throw switch to be operated at position 1 wherein the electrical signal denoted as IG is coupled to the gate electrode 26 and the signal over line 78, denoted as GS, is coupled to the gate electrode 30. Thus, the time waveforms of FIG. 5 are similar to the time waveforms of FIG. 3 with the waveforms of B and D interchanged. However, this selective interchanging of time waveform signals as applied to the gate electrodes 26 and 30 provides a dramatic effect with respect to decrementing a metered amount of charge from the capacitance of the doped region 18 through the charge transfer channel 14 into the doped region 16 of the charge-coupled device 10.

Figure 6:
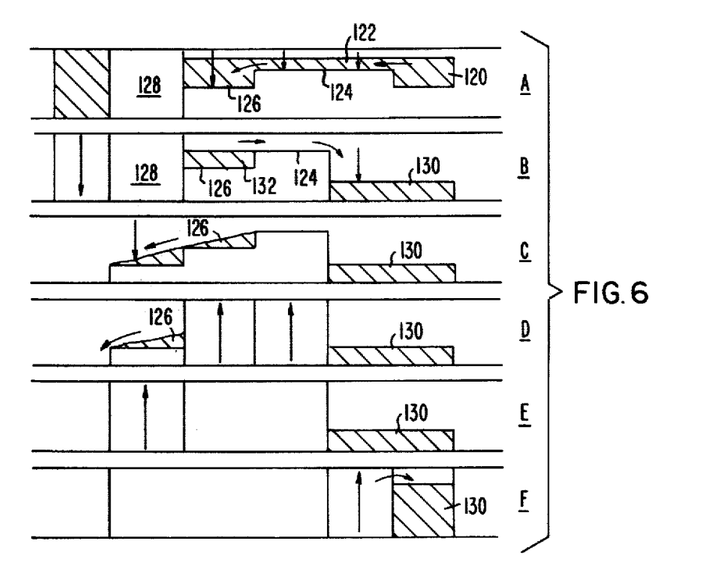
FIG. 6 depicts exemplary potential profiles under the gate electrodes of the CCD of FIG. 1 for selected times during a charge decrementation operation.

Referring to diagram A of FIG. 6, because of the first state of the voltage potentials of the electrical signals applied to the device 10 (i.e. immediately following time t1 in FIG. 5), charge from the capacitance of the doped region 18, as denoted by the hashed area 120, may be spread within the potential wells under the gate electrodes of 28, 30 and 32 as exhibited by the hashed area 122. The reference potential, applied to the gate electrodes 30 and 32, provide for a potential energy denoted by line 124 and the governing potential, applied to the gate electrode 28, provides for a potential energy denoted by line 126 in the potential well thereunder. The difference in charge distribution through the potential wells of the gate electrode 28 with respect to the potential wells of the gate electrodes 30 and 32 is proportional to the difference in the voltage potentials between the reference $2\mu\epsilon_0$ and governing $2\mu\epsilon$ potentials. Also, at the same time, since the electrical signal applied to the gate electrode 26 is repulsive, no substantive amount of charge is expected in the potential well thereunder as exhibited by the area 128.

Thereafter, at a time immediately following t2, the results of the second state of voltage potentials of the electrical signals applied to the charge-coupled device 10 may be operationally exhibited by the potential minimum diagram B of FIG. 6. Referring to the diagram B, charge under the potential wells of the gate electrodes 28 and 30 may be spilled over into the potential wells of the gate electrode 32 and the capacitance of the doped region 18 as exhibited by the hashed area 130. A metered amount of charge denoted by the hashed area 132 may remain in the potential well under the gate electrode 28 and may be commensurate to the difference in the potential minimums between the lines of 124 and 126 which may be proportional to the governing potential of $2\mu\epsilon$ as illustrated in the hashed area of the time waveform C in FIG. 5, at times t1 to t4. Again, there is no charge expected under the gate electrode 26, denoted by the area 128.

Thereafter, at a time immediately following t3 the voltage potential applied to the gate electrode 26 may be adjusted to an attractive potential as a result of the potential waveform variation of the electrical signal IG causing the metered amount of charge denoted at 126 to flow into the potential well developed under the gate electrode 26 as exhibited in the diagram C of FIG. 6. During the time period between t3 and t4 the remaining electrical signals applied to the CCD 10 have voltage potentials substantially fixed.

Subsequently, at a time immediately following time t4, the voltage potential on the gate electrode 28 may be adjusted to a repulsive potential as a result of the operation of switch 88. As exhibited in the diagram D of FIG. 6, since the voltage potential applied to the doped region 16 had been previously adjusted to an attractive potential level, the metered amount of charge 126 residing in the potential well under the gate electrode 26 may be spilled over into the doped region 16. For the remaining times immediately following t5 and t6, the voltage potentials supplied to the gate electrode 26 and 32 may be sequentially adjusted to a repulsive potential, respectively.

Thus, the remaining charge on the capacitance of the doped region 18 as denoted by the hashed area 130 in the diagram F of FIG. 6, constitutes a resulting amount of charge which has been decremented by a metered amount 126 which has been transferred to the doped region 16 in accordance with the potential minimum diagrams of A through F as described hereabove in connection with FIG. 6.

Figure 7:
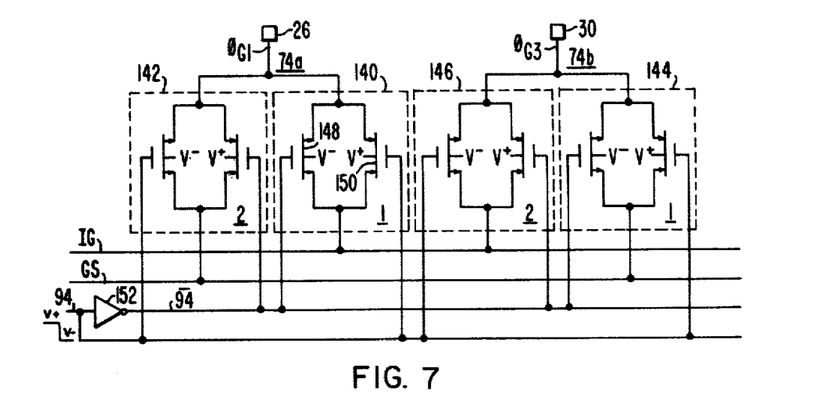
FIG. 7 depicts an embodiment of a double-pole-double-throw switch suitable for use in the circuit embodiment of FIG. 1.

With regard to the switch arrangements 60, 70, 74 and 88 of the schematic diagram embodiment of FIG. 1, all of these switch configurations may be implemented with well-known circuit design principles. One example of a switch arrangement for the double-pole-double-throw switch 74 is shown in the embodiment of FIG. 7. In the exemplary embodiment of FIG. 7, the switch 74$a$ may be comprised of two CMOS transmission gate 140 and 142 and likewise, the switch 74$b$ may also be comprised of two similarly assembled CMOS transmission gates 144 and 146. Each transmission gate may be made up of a parallel combination of a NMOS transistor and a PMOS transistor like that shown at 148 and 150, respectively, in the transmission gate of 140. For the purposes of controlling the transmission gates, the increment/decrement control signal 94 may be broken into two control signals 94 and its complement $\overline{94}$ as effected by a conventional inverter gate as shown at 152. Accordingly, the signal 94 may be connected to the gates of the NMOS transistors of the transmission gates 142 and 146 and also to the gates of the PMOS transistors of the transmission gates 140 and 144; similarly, the complement signal $\overline{94}$ may be connected to the gates of the PMOS transistors of the transmission gates 142 and 146 and in addition to the gates of the NMOS transistors of the transmission gates 140 and 144.

Consistent with the embodiment of FIG. 1, the signal IG may be connected to one end of the transmission gate 140 which is designated as the switch position 1 of 74$a$ and also connected to one end of the transmission gate 146 which is designated as switch position 2 of 74$b$. Likewise, the signal GS may be connected to one end of the transmission gate 142 designated as switch position 2 of 74$a$ and also to one end of the transmission gate 144 designated as switch position 1 of 74$b$. The other ends of the transmission gates 140 and 142 may be both connected to the gate electrode 26 and commonly carry the signal denoted as $\phi_{G1}$. In a similar arrangement, the other ends of the transmission gates 144 and 146 may be both connected to the gate electrode 30 and commonly carry the signal denoted as $\phi_{G3}$.

In operation then to select an increment mode, the signal 94 may be adjusted to a voltage potential V+ wherein the inverter 152 converts the complement $\overline{94}$ to a voltage potential of possibly V+. With the control signals 94 and $\overline{94}$ in this state, the PMOS and NMOS transistors of transmission gates 142 and 146 may be made conductive to pass the signals GS and IG to the gate electrodes 26 and 30, respectively. Under the same conditions, the PMOS and NMOS transistors of transmission gates 140 and 144 may be made nonconductive preventing passage of the signal IG and GS to the gate electrodes 26 and 30, respectively. Thus, the voltage potential, applied to the gate electrode 26 and 30, may be derived from the signals GS and IG consistent with the time waveforms of B and D described in connection with FIG. 3 hereabove.

To decrement charge, the control signal 94 may be adjusted to a V− voltage potential; in which case, the inverter 152 converts the signal $\overline{94}$ to V+ potential. In this voltage potential state, the PMOS and NMOS transistors of transmission gates 140 and 144 may be made conductive to connect the signals of IG and GS to the gate electrodes 26 and 30, respectively. With this same condition, the transmission gates 142 and 146 may be blocked preventing conduction of the signals GS and IG from making contact with the gate electrodes 26 and 30, respectively. Therefore, the voltage potential, applied to the gate electrodes 26 and 30, is derived from the signals IG and GS, consistent with the time waveforms of B and D, respectively, as described in connection with FIG. 5 hereabove.

The switches 60, 70 and 88 may use similar circuit arrangements of PMOS and NMOS transistors to implement their functional role in the embodiment of FIG. 1. These techniques of designing switches are considered well known to those skilled in the pertinent art and are not considered in any way as part of the present invention.

We claim:

1. A bidirectional charge control circuit for incrementing and decrementing metered amounts of charge on a charge storage medium, said circuit comprising:

a semiconductor substrate body doped with a first impurity type and having a predefined charge transfer channel therein;

a first semiconductor region, doped with a second impurity type, disposed at one end of said predefined channel and located at the surface of said substrate body, said charge storage medium being coupled to another end of said predefined charge transfer channel, opposite said one end in the direction of charge transfer;

a gate dielectric lying on top of said semiconductor substrate body at least covering said predefined charge transfer channel surface area;

first, second, third and fourth gate electrodes disposed on said gate dielectric layer, adjacently aligned, respectively, in a direction from said first doped region to said charge storage medium across said predefined channel area, said gate electrodes being substantially isolated from each other, said first doped region, and said charge storage medium;

a first electrical signal coupled electrically to said first doped semiconductor region and operative to provide charge thereto in accordance with a first timing sequence;

a first electrical circuit for generating second and third electrical signals having varying potentials respectively corresponding to second and third timing sequences;

an electrical switch selectively operative in a first state to couple said second and third electrical signals to said first and third gate electrodes, respectively, for incrementing charge and in a second state to couple said second and third electrical signals to said third and first gate electrodes, respectively, for decrementing charge;

a fourth electrical signal coupled electrically to said second gate electrode and having at times a governing potential, commensurate with said metered amounts of charge associated with said incrementing and decrementing operations; and a second electrical circuit for generating a fifth electrical signal having a potential varying in accordance with a fourth timing sequence, said fifth electrical signal being coupled to said fourth gate electrode, whereby metered amounts of charge may be incremented and decremented, selectively, to and from the charge storage medium, respectively, in accordance with the time varying potential sequences of the first through the fifth generated electrical signals and the selective operations of the electrical switch.

2. A bidirectional charge control circuit in accordance with claim 1 wherein the charge storage medium comprises a second semiconductor region, doped with a second impurity type, disposed at the other end of the predefined channel and located at the surface of the substrate body.

3. A bidirectional charge control circuit in accordance with claim 2 including an auxiliary charge storage medium coupled to the second doped semiconductor region for increasing the charge storage capacity thereof.

4. A bidirectional charge control ciruit in accordance with claim 1 wherein the charge storage medium is a holding well under a charge storage gate of a charge coupled device.

5. A bidirectional charge control circuit in accordance with claim 1 wherein the first electrical circuit includes circuitry for varying the potentials of the second and third signals in accordance with periodic second and third timing sequences, respectively, the periodicity of each sequence comprising mutually at least six concurrent time segments; wherein the potential of the generated second signals is maintained at an adjusted reference potential for the first three time segments of each of said periods and maintained at a repulsive potential for the next three time segments of each of said periods; and wherein the potential of the generated third signal is maintained at said repulsive potential for the first two time segments of each of said periods, maintained at an attractive potential for the next two time segments of each of said periods, and returned to said repulsive potential for the following two time segments of each of said periods.

6. A bidirectional charge control circuit in accordance with claim 5 wherein the potential of the fourth electrical signal is maintained at the governing potential at times concurrent with the first three time segments of each of the periods of the generated second and third electrical signals and thereafter, maintained at the repulsive potential for the remainder of each of said periods.

7. A bidirectional charge control circuit in accordance with claim 5 wherein the first electrical signal provides charge to the first doped semiconductor region, at times, concurrent with the first time segment of each of the periods of the generated second and third signals.

8. A bidirectional charge control circuit in accordance with claim 5 wherein the second electrical circuit includes circuit means for varying the potential of the fifth electrical signal to be at the adjusted reference potential for the first time segment of each of the periods of the generated second and third signals, to be at the attractive potential for the second through the fifth time segments of each of said periods, and to be at the repulsive potential for the sixth time segment of each of said periods.

9. A bidirectional charge control circuit in accordance with claim 5 wherein the electrical switch is rendered operative in the first state to initiate charge incrementation at times concurrent with the beginning of the first time segments of the periods of the generated second and third signals.

10. A bidirectional charge control circuit in accordance with claim 5 wherein the electrical switch is rendered operative in the second state to initiate charge decrementation at times concurrent with the beginning of the first time segment of the periods of the generated second and third signals.

11. A bidirectional charge control circuit for selectively performing one of the operations of incrementing and decrementing metered amounts of charge on a charge storage medium over a sequence of six time segments, said circuit comprising:

a semiconductor substrate body doped with a first impurity type and having a predefined charge transfer channel therein;

first and second semiconductor regions, doped with a second impurity type, disposed, respectively, at each end of said predefined channel and located at the surface of said substrate body;

a gate dielectric lying on top of said semiconductor substrate body at least covering said predefined charge transfer channel surface area;

first, second, third and fourth gate electrodes disposed on said gate dielectric layer, adjacently aligned, respectively, in the direction from said first doped region to said second doped region across said predefined channel area, said gate electrodes being substantially isolated from each other and said first and second doped region;

a first electrical signal coupled electrically to said first doped semiconductor region and operative to provide charge thereto in the first time segment of said sequence;

a first electrical circuit for generating a second electrical signal having an adjusted reference potential for the first three time segments and a repulsive potential for the remaining three time segments of said sequence, and for generating a third electrical signal having a repulsive potential for the first two time segments, an attractive potential for the intermediate time segments, and returning to said repulsive potential for the remaining two time segments of said sequence;

an electrical switch selectively operative in a first state to couple said second and third electrical signals to said first and third gate electrodes, respectively, for incrementing charge and in a second state to couple said second and third electrical signals to said third and first gate electrodes, respectively, for decrementing charge;

a fourth electrical signal coupled electrically to said second gate electrode and having a governing potential for the first three time segments and a repulsive potential for the remaining three time segments of said sequence, said governing potential being commensurate in value with the metered amounts of charge associated with the incrementing and decrementing operations; and a second electrical circuit for generating a fifth electrical signal having said adjusted reference potential for the first time segment, said attractive potential for the second through the fifth time segments, and said repulsive potential for the sixth time segment of said sequence, said fifth electrical signal being coupled to said fourth gate electrode, whereby metered amounts of charge may be selectively incremented and decremented to and from the second doped semiconductor region, respectively, in accordance with the time varying potentials of the first through the fifth generated electrical signals over the time segmented sequence and the operational state of the electrical switch.

12. A bidirectional charge control circuit in accordance with claim 11 including an auxiliary charge storage medium coupled to the second doped semiconductor region for increasing the charge storage capacity thereof.

13. In a charge coupled device (CCD) having a four gate structure disposed over a charge transfer channel and first and second doped regions located, respectively, at each end of said channel, a method for decrementing a metered amount of charge from said second doped region through said channel to said first doped region, said CCD gates being enumerated one through four, respectively, in the direction from said first to said second doped region, said method comprising:
   applying first, second, third and fourth electrical signals to the first through fourth CCD gates, respectively;
   adjusting the potentials of said first through fourth electrical signals to a first state to cause charge to spread from said second doped region into formed potential wells in said charge transfer channel under said second, third and fourth gates;
   adjusting the potentials of said first through fourth electrical signals to a second state to cause charge to spill from said formed potential wells under said second and third gates to said formed potential well of said fourth gate and said second doped region leaving a metered amount of charge in said potential well under said second gate;
   applying a fifth electrical signal with an attractive potential to said first doped region;
   adjusting the potentials of said first through fourth electrical signals to a third state to cause said metered amount of charge to flow from said potential well of said second gate through said potential well of said first gate to said first doped region; and
   adjusting the potentials of said first through fourth electrical signals to at least one other state to return the remaining charge in said channel to said second doped region.

14. The method in accordance with claim 13 wherein the step of adjusting the potentials of the first through fourth electrical signals to a first state includes:
   adjusting the potentials of the third and fourth electrical signals to a reference potential;
   adjusting the potentials of the second electrical signal to a governing potential which is commensurate with the metered amount of charge to be decremented; and
   adjusting the potential of the first electrical signal to a repulsive potential;
   wherein the step of adjusting the potentials of the first through fourth electrical signals to a second state includes:
   maintaining the first electrical signal at said repulsive potential, the second electrical signal at said governing potential and the third electrical signal at said reference potential; and
   adjusting the fourth electrical signal to an attractive potential;
   wherein the step of adjusting the potentials of the first through fourth electrical signals to a third state includes:
   maintaning the second electrical signal at said governing potential, the third electrical signal at said reference potential and the fourth electrical signal at said attractive potential; and
   adjusting the first electrical signal to an attractive potential; and
   wherein the step of adjusting the potentials of the first through fourth electrical signals to at least one other state includes:
   maintaining temporarily the first and fourth electrical signals at said attractive potentials;
   adjusting the second and third electrical signals to a repulsive potential;
   thereafter, adjusting the first electrical signal to a repulsive potential; and
   thereafter, adjusting the fourth electrical signal to a repulsive potential.

* * * * *